(12) United States Patent
Haseyama et al.

(10) Patent No.: US 7,028,398 B2
(45) Date of Patent: Apr. 18, 2006

(54) CONTACTOR, A METHOD OF MANUFACTURING THE CONTACTOR AND A DEVICE AND METHOD OF TESTING ELECTRONIC COMPONENT USING THE CONTACTOR

(75) Inventors: Makoto Haseyama, Kawasaki (JP); Shigeyuki Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 10/629,800

(22) Filed: Jul. 30, 2003

(65) Prior Publication Data

US 2004/0070010 A1    Apr. 15, 2004

Related U.S. Application Data

(62) Division of application No. 09/531,686, filed on Mar. 20, 2000, now Pat. No. 6,630,839.

(30) Foreign Application Priority Data

Sep. 2, 1999    (JP)    ............................ 11-249225

(51) Int. Cl.
*H01R 9/00*    (2006.01)
(52) U.S. Cl. .......................................... 29/842; 29/844
(58) Field of Classification Search .................. 29/842, 29/846, 593
See application file for complete search history.

(56) References Cited

U.S. PATENT DOCUMENTS

| | | | |
|---|---|---|---|
| 5,625,298 A | 4/1997 | Hirano et al. | ................ 324/754 |
| 5,629,630 A | 5/1997 | Thompson et al. | ......... 324/754 |
| 5,802,699 A * | 9/1998 | Fjelstad et al. | ............... 29/593 |
| 5,812,378 A * | 9/1998 | Fjelstad et al. | ............. 361/769 |
| 5,926,029 A | 7/1999 | Ference et al. | ............. 324/762 |
| 6,086,386 A * | 7/2000 | Fjelstad et al. | ............... 439/70 |

FOREIGN PATENT DOCUMENTS

JP    11-97497    4/1999

* cited by examiner

*Primary Examiner*—Carl J. Arbes
(74) *Attorney, Agent, or Firm*—Westerman, Hattori, Daniels & Adrian, LLP

(57) ABSTRACT

A contactor is used for testing an integrated circuit electronic component provided with a plurality of electrodes. The contactor includes an insulating base material provided with holes formed at positions corresponding to the electrodes, a first conductive layer having contacts which are plastically deformed portions of the first conductive layer, and reinforcement members provided on the contacts on a first surface of the contacts. The first surface of the contacts is facing towards the holes. The contacts are provided at positions corresponding to the electrodes for enabling an electrical connection to the electronic component and are protruded from the insulating base material.

3 Claims, 12 Drawing Sheets

CONTACTOR, A METHOD OF MANUFACTURING THE CONTACTOR AND A DEVICE AND METHOD OF TESTING ELECTRONIC COMPONENT USING THE CONTACTOR

This application is a divisional of prior application Ser. No. 09/531,686 filed Mar. 20, 2000 now U.S. Pat. No. 6,630,839.

BACKGROUND OF THE INVENTION

1. Field of the Invention

The present invention generally relates to a contactor used for testing an integrated circuit electronic component. The present invention particularly relates to a contactor used for testing high-density semiconductor chips, a testing device using such a contactor, a method of manufacturing such a contactor and a testing method using such a contactor.

Recently, there is a need for electronic components, particularly semiconductor chips, which are provided with electronic circuits having reduced size, increased processing speed and high density. Accordingly, electrodes provided on such an electronic circuit will have a fine-pitched structure. Therefore, there is a need for a contactor which can establish a secure electrical connection with the electronic circuit when testing or mounting such an electronic circuit.

2. Description of the Related Art

It is known to use a contactor for testing an electronic component such as a semiconductor device. During the test, the contactor is electrically connected to the electronic component to be tested. One example of such contactor is a membrane type contactor including a thin insulating film provided with hemispherical contacts plated thereon. During the test, the hemispherical contacts are connected to spherical connection terminals (bumps) of the semiconductor device.

FIG. 1 is a cross-sectional diagram showing a contactor 1A of the membrane type. The membrane-type contactor 1A includes a thin insulating base material 2A provided with a plurality of hemispherical contacts 3A (hereinafter referred to as membrane contacts) plated thereon. During the test, the membrane contacts 3A are connected to electrodes (e.g., pads or bumps) of a semiconductor device (not shown).

The insulating substrate 2A overlies on a resilient board 4A. Even if there is a height variation between the electrodes of the semiconductor device, an electric connection between the contactor and the semiconductor device is ensured due to an elastic deformation of the resilient board 4A.

An electrically conductive layer 5A is provided on an upper surface of the insulating substrate 2A. The conductive layer 5A is connected to the membrane contacts 3A and serves as interconnections between the membrane contacts 3A and peripheral positions of the insulating substrates 2A.

With the membrane-type contactor 1A, the membrane contacts 3A are typically provided as protruded electrodes formed by a plating process. Such plating process has several drawbacks. One of the drawbacks may be that a mask is needed for accurately forming the membrane contacts 3A on the conductive layer 5A at positions corresponding to the electrodes of the semiconductor device. Another drawback may be that, for obtaining membrane contacts 3A having height sufficient for good contact with the electrodes of the semiconductor device, a precise conditioning of, for instance, the density of the plating liquid is required. Further, a comparatively long period of time is required for obtaining membrane contacts 3A having sufficient height.

Therefore, with the plating process, it is generally a time-consuming and complicated to form the membrane contacts 3A having good electrical connection with the semiconductor device.

Also, since the shape of the thus-formed membrane contact 3A has a very small aspect ratio, it requires a lengthy plating growth time for obtaining the membrane contacts having a sufficient height. Also, further problems may be that a distance (pitch) between the electrodes of the semiconductor device cannot be reduced over a certain extent, and that uniformity of a height and shape is degraded as the height of the contact is increased.

SUMMARY OF THE INVENTION

Accordingly, it is a general object of the present invention to provide a contactor used for testing electronic components which can achieve a secure electrical connection with electronic components having fine-pitched structure.

It is another and more specific object of the present invention to provide a contactor provided with contacts having a simple structure and can be manufactured in a simple manner.

In order to achieve the above objects according to the present invention, there is provided a contactor used for testing an integrated circuit electronic component provided with a plurality of electrodes, the contactor including:

an insulating base material provided with holes formed at positions corresponding to said electrodes;

a first conductive layer having contacts which are plastically deformed portions of said first conductive layer, said contacts being provided at positions corresponding to said electrodes for enabling an electrical connection to said electronic component and being protruded from said insulating base material; and reinforcement members provided on said contacts on a first surface of said contacts, said first surface being facing towards said holes.

It is still another object of the present invention to provide a method of manufacturing a contactor in a simple manner.

In order to achieve the above objects according to the present invention, there is provided a method of manufacturing a contactor used for testing an integrated circuit electronic component provided with a plurality of electrodes, the method including the steps of:

a) preparing a wiring substrate having an insulating base material and a first conductive layer; and b) forming contacts by mechanically pressing the wiring substrate such that the first conductive layer is plastically deformed at positions corresponding to the electrodes.

A method and a device for testing an electronic component using the contactor of the present invention are also provided.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 1:
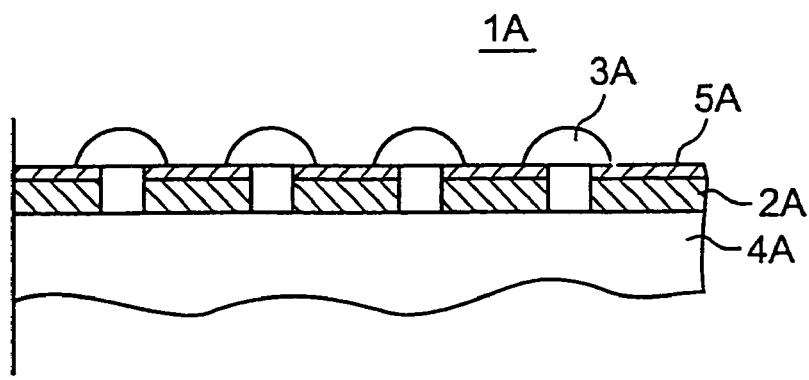
FIG. 1 is a cross-sectional diagram showing a contactor of the related art.
Figure 2:
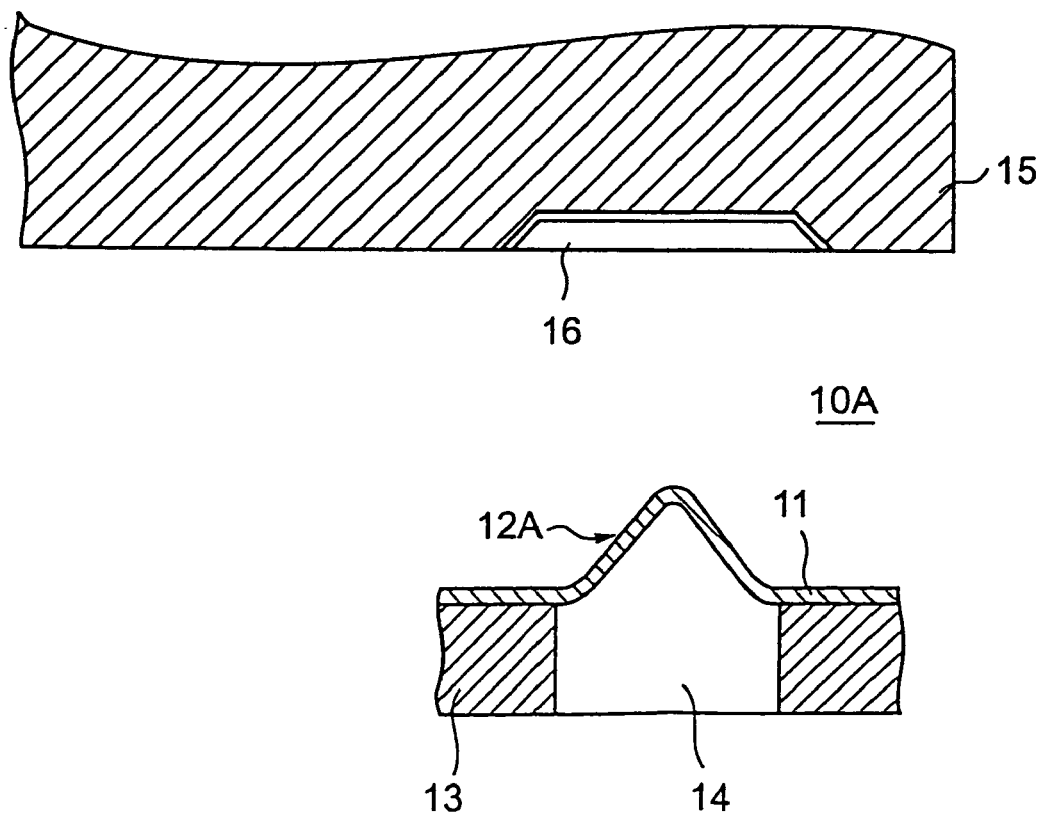
FIG. 2 is an enlarged cross-sectional diagram showing a contactor of a first embodiment of the present invention.

FIG. 2 is an enlarged cross-sectional diagram showing a contactor 10A of a first embodiment of the present invention, which may be used for testing an integrated circuit electronic component (hereinafter referred to as electronic component) such as a semiconductor device. FIG. 2 also shows an integrated circuit electronic component (hereinafter referred to as electronic component) 15 so as to illustrate the positioning of the contactor 10A and the electronic component 15. As has been described above, the integrated circuit electronic component 15 may be semiconductor device.

The contactor 10A generally includes an insulating base material 13 and a conductive layer 11 overlying on the insulating base material 13. The conductive layer 11 serves as an interconnection for use in a test on the electronic component. The conductive layer 11 is provided with a plurality of protruded contacts 12A, which are plastically deformed portions of the conductive layer 11. The protruded contacts 12A are provided at positions corresponding to the electrodes (pads or bumps) of the electronic component. In the figure, only one of the plurality of protruded contacts 12A is illustrated.

The electronic component 15 is provided with a plurality of electrodes, in the present embodiment, electrode pads 16, only one which being illustrated for the sake of clarity. In order to test the electronic component 15, the contactor 10A will be connected to the electrode pad 16.

The present embodiment takes advantage over the contactor of the related art in that the protruded contacts 12A are mechanically formed. An example of the mechanical process may be a pressing process resulting in a plastic deformation of the conductive layer 11 that provides the protruded contacts 12A.

In order to implement predetermined tests on the electronic component, the protruded contacts 12A are electrically connected to respective electrodes of the electronic component 15.

In the present embodiment, a plurality of holes 14 are provided in the insulating base material 13 at positions corresponding to electrodes 16 of the electronic component 15. The holes 14 facilitate the above-described pressing process, thus reducing the time required for forming the protruded contacts 12A. The contactor 10A of the present embodiment has a good connectivity to the electronic component due to a load concentration provided by a protruded shape of the protruded contacts 12A.

Figure 3:
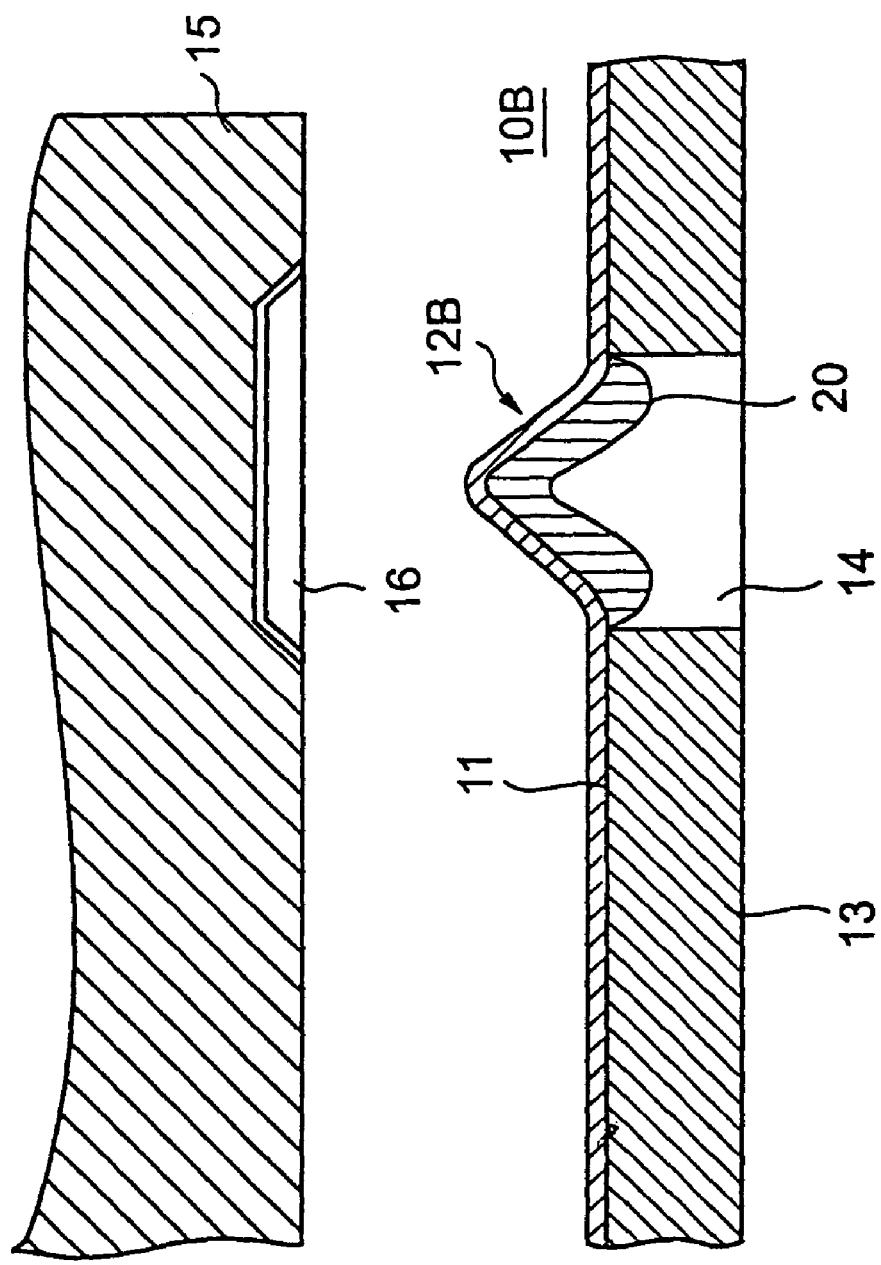
FIG. 3 is an enlarged cross-sectional diagram showing a contactor of a second embodiment of the present invention.

FIG. 3 is an enlarged cross-sectional diagram showing a contactor 10B of a second embodiment of the present invention. FIG. 3 also shows the electronic component 15.

Through out the figures, elements similar to those of the electric component contactor 10A of the first embodiment shown in FIG. 2 are shown with like reference numerals.

The contactor 10B includes the conductive layer 11, the insulating base material 13 and a plated part 20. In the present embodiment, the insulating base material 13 is provided with a plurality of holes 14.

The conductive layer 11 is plastically deformed such that protruded contacts 12B are formed on the conductive layer 11 at positions corresponding to the electrode pads 16 of the electronic component 15. The contactor 10B of the present embodiment further includes the plated parts 20 provided on the protruded contacts 12B on a surface facing towards the holes 14. The plated parts 20 serves as reinforcement members of the protruded contact 12B.

Therefore, the contactor 10B of the present embodiment is improved over the first embodiment in that a better electrical contact between the electrode pad 16 of the electronic component 15 can be achieved by means of the reinforced protruded contact 12B.

Figure 4:
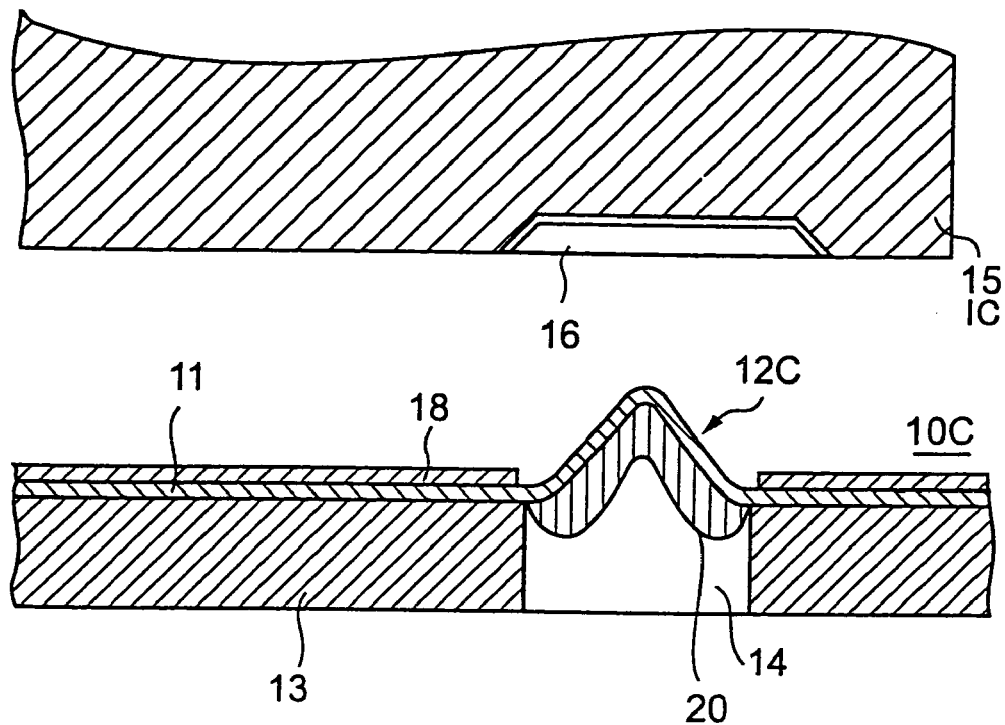
FIG. 4 is an enlarged cross-sectional diagram showing a contactor of a third embodiment of the present invention.

FIG. 4 is an enlarged cross-sectional diagram showing a contactor 10C of a third embodiment of the present invention. FIG. 4 also shows the electronic component 15.

The contactor 10C of the present embodiment is similar to the contactor 10B shown in FIG. 3 except that a non-conductive layer 18 is provided on the conductive layer 11 at positions other than protruded electrodes 12C. Thus, the conductive layer 11 is covered with the non-conductive layer 18 in the present embodiment, whereas the conductive layer 11 is exposed in the second embodiment shown in FIG. 3.

Thus, with the contactor 10C of the present embodiment, since the conductive layer 11 is covered with the non-conductive layer 18, any wiring pattern other than the protruded contact 12C is prevented from being electrically connected to a circuit forming surface of the electronic component 15.

Figure 5:
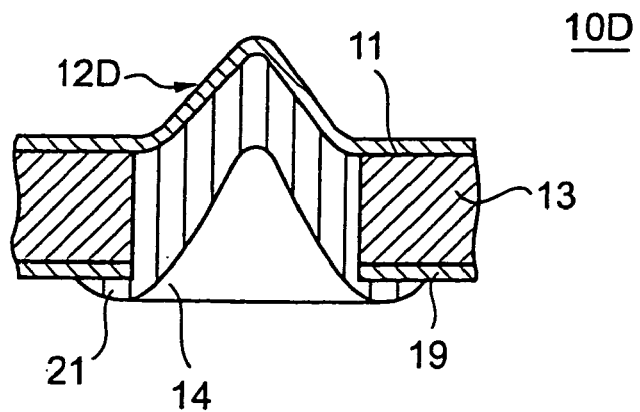
FIG. 5 is an enlarged cross-sectional diagram showing a contactor of a fourth embodiment of the present invention.

FIG. 5 is an enlarged cross-sectional diagram showing a contactor 10D of a fourth embodiment of the present invention.

The contactor 10D is provided with some additional features but is otherwise similar to the contactor 10B of the second embodiment shown in FIG. 3. The contactor 10D is further provided with a further conductive layer 19 and a plated part 21. The further conductive layer 19 is a patterned conductive layer separate from the conductive layer 11.

The further conductive layer 19 and the conductive layer 11 are provided on opposite sides of the insulating base material 13. The plated part 21 is similar to the plated part 20 of the second embodiment but extends to the further conductive layer 19. Thus, an electrical connection is established between the conductive layer 11 and the further conductive layer 19. Thus, the contactor 10D of the present embodiment can be used for testing a high-density electronic component.

Figure 6A:
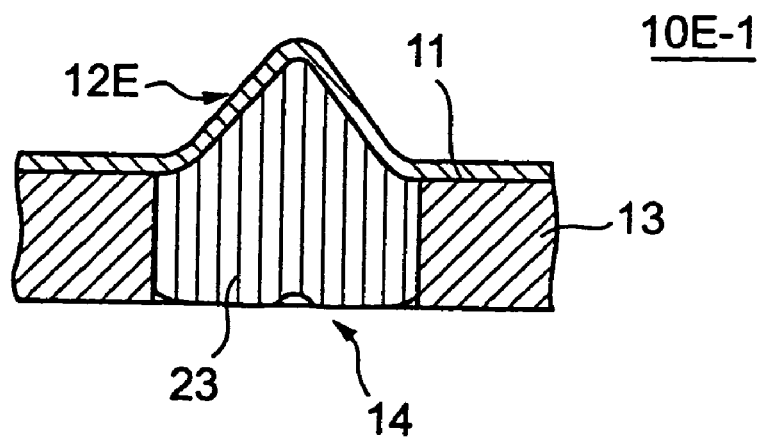
FIGS. 6A and 6B are enlarged cross-sectional diagrams showing contactors of a fifth embodiment of the present invention.
Figure 6B:
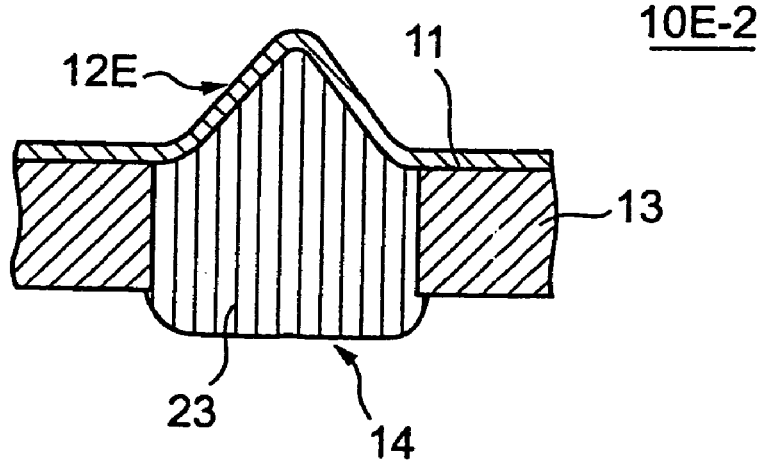

FIGS. 6A and 6B are enlarged cross-sectional diagrams showing contactors 10E-1 and 10E-2, respectively, of a fifth embodiment of the present invention.

The contactors 10E-1 and 10E-2 shown in FIGS. 6A and 6B are similar to the contactor 10B of the second embodiment except for the shape of plated parts.

Referring to FIG. 6A, the conductive layer 11 is plastically deformed such that protruded contacts 12E are formed on the conductive layer 11 at positions corresponding to the electrodes of the electronic component (not shown). The contactor 10E-1 of the present embodiment further includes plated parts 22 provided on the protruded contacts 12E on a surface facing towards the holes 14. In the present embodiment, the plated part 22 is formed flush with a surface of the insulating base material 13 opposite to a surface bearing the conductive layer 11.

Thus, by providing the plated part 22 which is flush with the surface of the insulating base material 13, a sufficient pressure is exerted between the electrode pad 16 (see FIG. 3) of the electronic component 15 and the protruded contact 12E. This gives a good electrical connection between the electrode pad 16 of the electronic component 15 and the protruded contact 12E.

In the embodiment shown in FIG. 6B, a plated part 23 protrudes from a surface of the insulating base material 13 opposite to a surface bearing the conductive layer 11.

Thus, by providing the plated part 23 which is protruded from the surface of the insulating base material 13, a sufficient pressure is exerted between the electrode pad 16 (see FIG. 3) of the electronic component 15 and the protruded contact 12E. This gives a good electrical connection between the electrode pad 16 of the electronic component 15 and the protruded contact 12E.

Figure 7A:
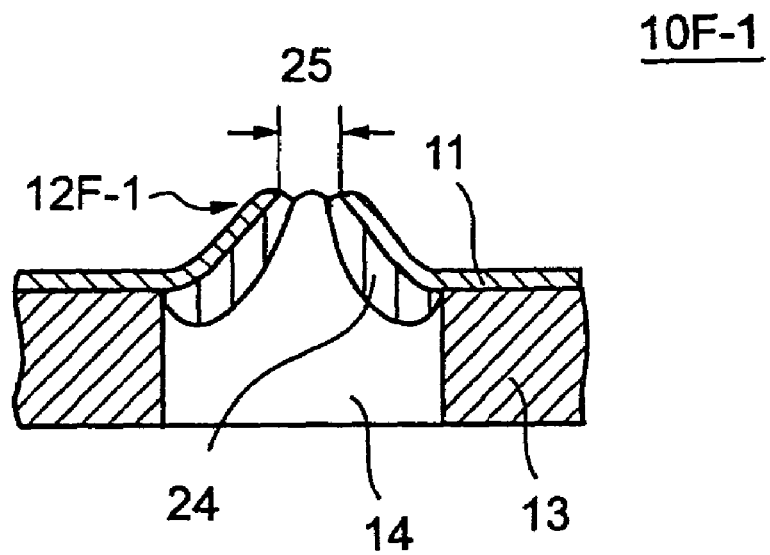
FIGS. 7A and 7B are enlarged cross-sectional diagrams showing contactors of a sixth embodiment of the present invention.
Figure 7B:
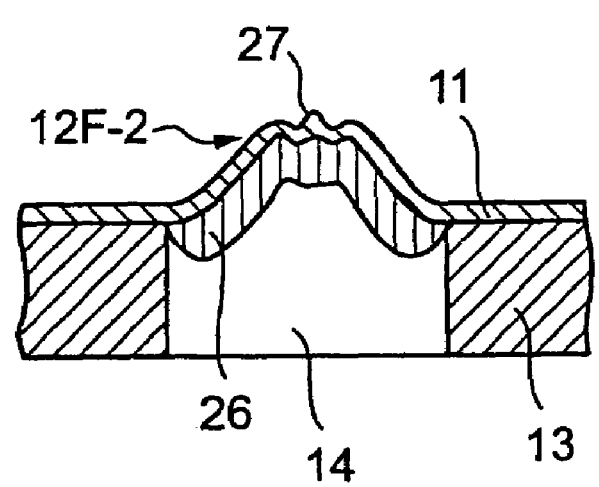

FIGS. 7A and 7B are enlarged cross-sectional diagrams showing contactors 10F-1 and 10F-2, respectively, of a sixth embodiment of the present invention.

The contactors 10F-1 and 10F-2 shown in FIGS. 7A and 7B are similar to the contactor 10B of the second embodiment except for the shape of the protruded contacts.

As shown in FIG. 7A, a protruded contact 12F-1 is provided with a top rim part 25 surrounding an opening at the top of the protruded contact 12F-1. The contactor 10F-1 of the present embodiment includes plated parts 24 provided on the protruded contacts 12F-1 on a surface facing towards the holes 14. The plated parts 24 serves as reinforcement members of the protruded contact 12F-1. With the top rim part 25 at the top of the protruded contact 12F-1 of the contactor 10F-1, a contact area between the electrode pads 16 of the electronic component 15 (see FIG. 3) and the protruded contact 12F-1 is increased. Thereby, a secure electric contact can be obtained.

In FIG. 7B, a protruded contact 12F-2 is provided with an irregular top part 27 having an irregular surface. The contactor 10F-2 of the present embodiment includes plated parts 26 provided on the protruded contacts 12F-2 on a surface facing towards the holes 14. The plated parts 26 serves as reinforcement members of the protruded contact 12F-2. With the irregular top part 27 at the top of the protruded contact 12F-2 of the contactor 10F-2, a contact area between the electrode pads 16 of the electronic component 15 (see FIG. 3) and the protruded contact 12F-2 is increased. Thereby, a secure electric connection can be obtained.

Figure 8:
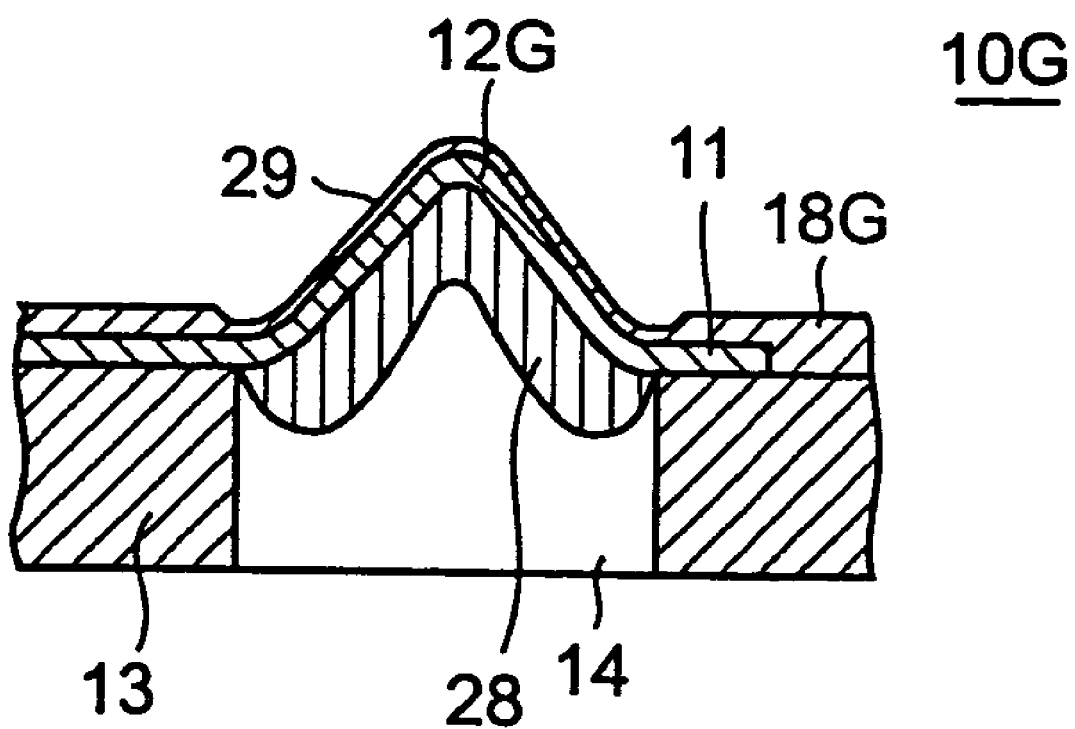
FIG. 8 is an enlarged cross-sectional diagram showing a contactor of a seventh embodiment of the present invention.

FIG. 8 is an enlarged cross-sectional diagram showing a contactor 10G of a seventh embodiment of the present invention.

The contactor 10G is has a structure similar to that of the contactor 10C of the third embodiment shown in FIG. 4. In the third embodiment, the protruded contact 12C is directly connected to the electrode pads 16 of the electronic component 15 (see FIG. 4). Whereas, in the present embodiment, a further plated part 29 is provided on the conductive layer 11 on a surface to be connected to the electrode pad 16 at positions corresponding to the protruded contact 12G.

With the further plated part 29 on the outer surface of the protruded contact 12G, a better electric connection can be achieved between the protruded contact 12G and the electrode pad 16.

In a similar manner to the contactor 10C if the third embodiment, the contactor 10G may be provided with a non-conductive layer 18G. The conductive layer 11 is covered with the non-conductive layer 18G except for the positions corresponding to the protruded contacts 12G. Therefore, any wiring pattern other than the protruded contact 12G is protected and is prevented from being electrically connected to the circuit on the electronic component 15.

Figure 9A:
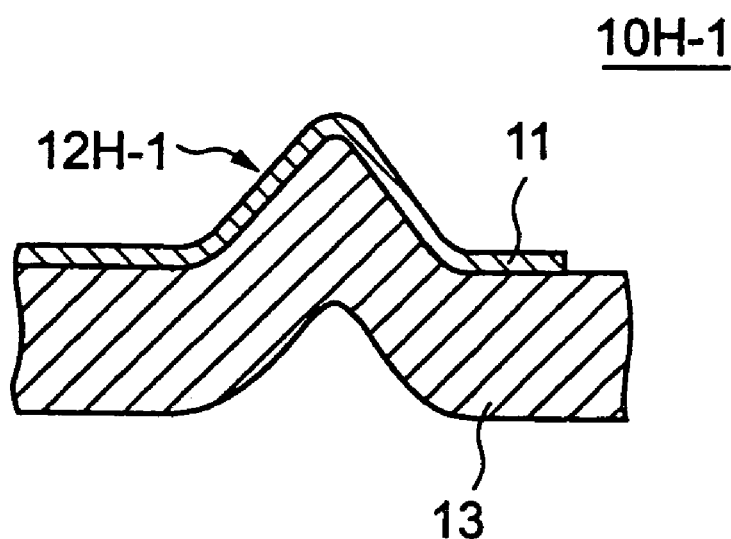
FIGS. 9A and 9B are enlarged cross-sectional diagrams showing contactors of an eighth embodiment of the present invention.
Figure 9B:
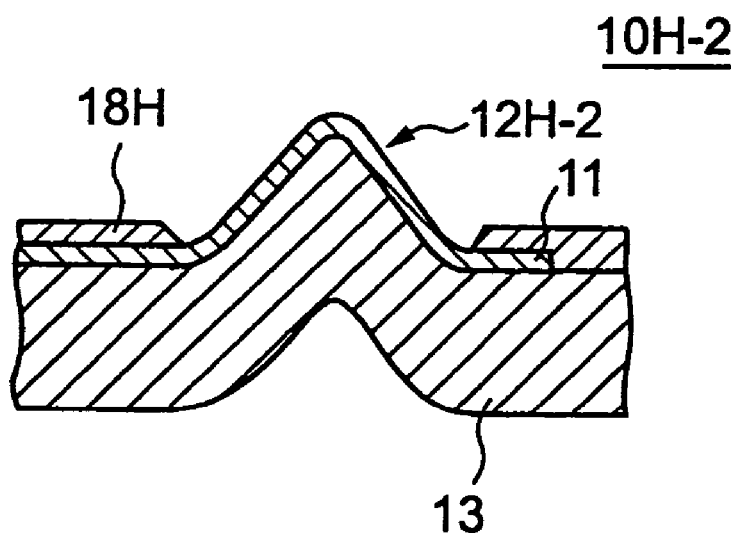

FIGS. 9A and 9B are enlarged cross-sectional diagrams showing contactors 10H-1 and 10H-2, respectively, of an eighth embodiment of the present invention.

The contactors 10H-1 and 10H-2 shown in FIGS. 9A and 9B include the insulating base material 13 having no holes 14 formed therein.

The contactor 10H-1 shown in FIG. 9A includes insulating base material 13 with no holes and the conductive layer 11 provided thereon. Protruded contacts 12H-1 are mechanically formed at positions corresponding to the electrode pads of the electronic component. Thus, the contactor 10H-1 of the present embodiment can be manufactured with reduced time compared to the contactor of the related art.

The contactor 10H-2 shown in FIG. 9B includes the base material 13 with no holes, and thus has a structure similar to that of the contactor 10H-1 shown in FIG. 9A.

First, protruded contacts 12H-2 are mechanically formed at positions corresponding to the electrode pads of the electronic component. Then, a non-conductive layer 18H is provided on the conductive layer 11 at positions other than the protruded contacts 12H-2. Thus, with the contactor 10H-2 of the present embodiment, any wiring pattern other than the protruded contact 12C is prevented from being electrically connected to the circuit on the electronic component 15.

The protruded contacts 12H-2 are mechanically formed from the insulating base material 13 with no holes. Thus, the contactor 10H-1 of the present embodiment can be manufactured with reduced time compared to the contactor of the related art.

Figure 10:
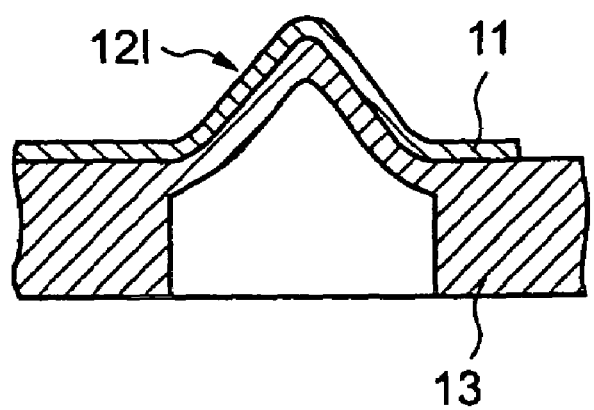
FIG. 10 is an enlarged cross-sectional diagram showing a contactor of a ninth embodiment of the present invention.

FIG. 10 is an enlarged cross-sectional diagram showing a contactor 10I of a ninth embodiment of the present invention.

The contactor 10I includes the conductive layer 11 and the insulating base material 13. The contactor 10I is characterized in that the thickness of the insulating base material 13 is smaller at protruded contacts 12I than at regions of the insulating base material 13 not connected to the electrode pads 16 of the electronic component.

The insulating base material 13 having reduced thickness at positions corresponding to the protruded contacts 12I are plastically deformed into protruded electrodes 12I.

Thus, with the insulating base material 13 having reduced thickness at positions corresponding to the protruded contacts 12I, the manufacturing process of the protruded contacts 12I is facilitated.

Figure 11:
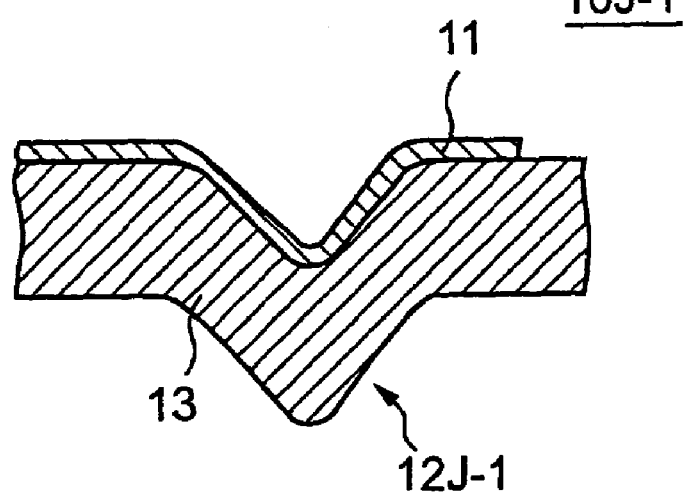
FIG. 11 is an enlarged cross-sectional diagram showing a contactor of the tenth embodiment of the present invention.

FIG. 11 is an enlarged cross-sectional diagram showing a contactor 10J-1 of a tenth embodiment of the present invention.

The contactor 10J-1 is similar to the contactor 10H-1 of the eighth embodiment except that the direction of protrusion of protruded contacts 12J-1 is opposite to that of the protruded contacts 12H-1.

Thus, when the electronic component having protruded electrodes is tested, it can be avoided that the protruded electrodes of the electronic component directly come into contact with top parts of the protruded contacts 12J-1. Therefore, the load applied on the top parts of the protruded contacts 12J-1 can be reduced.

Figure 12:
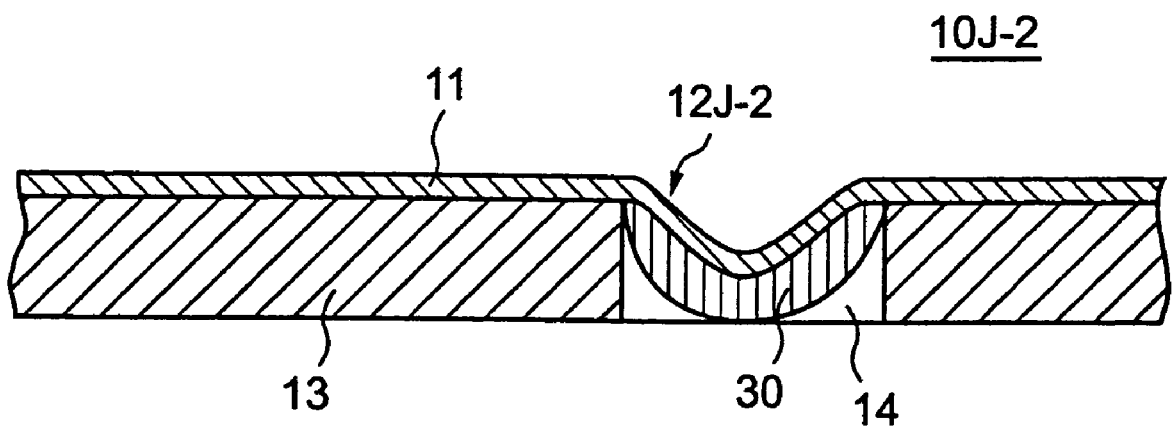
FIG. 12 is an enlarged cross-sectional diagram showing a contactor which is a variant of the contactor of the tenth embodiment of the present invention.

FIG. 12 is an enlarged cross-sectional diagram showing a contactor 10J-2 which is a variant of the contactor 10J-1 of the tenth embodiment of the present invention.

In FIG. 12, the conductive layer 11 is plastically deformed to form protruded contacts 12J-2 which are similar to the protruded contacts 12J-2 of the contactor 10J-1 shown in FIG. 11. The protruded contact 12J-2 is reinforced by a plated part 30 provided on the surface of the conductive layer 11 facing the hole 14.

The contactor 10J-2 also has an effect that the load applied on the top parts of the protruded contacts 12J-1 can be reduced.

Figure 13:
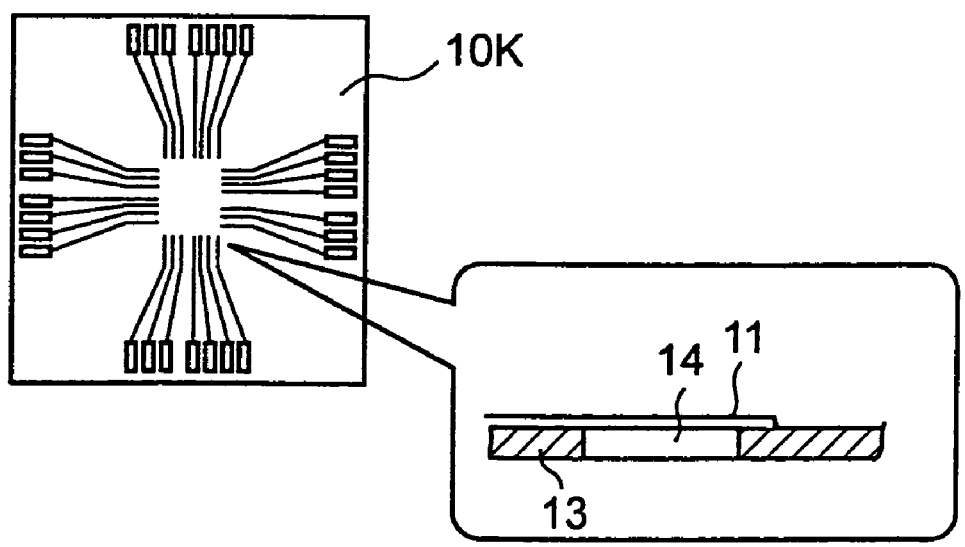
FIG. 13 is a plan view of a test wiring board to be formed into a contactor.

FIG. 13 is a plan view showing a wiring board 10K to be formed into a contactor. The wiring board 10K includes the insulating base material 13 provided with a plurality of holes 14 and a conductive layer 11 overlying the insulating base material 13. In the following, various steps of forming protruded contacts on the conductive layer 13 at positions corresponding to the holes 14 will be described.

Figure 14A:
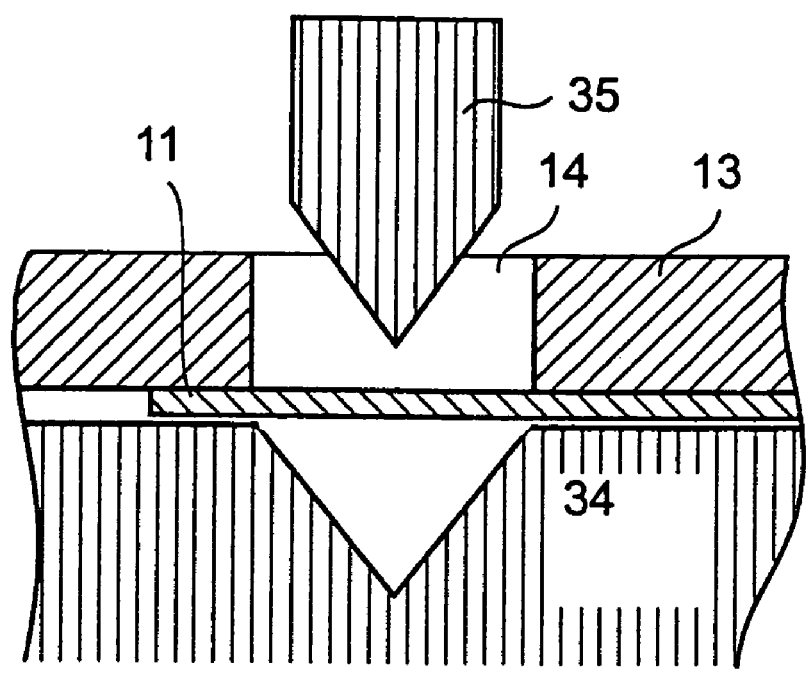
FIGS. 14A to 14C are diagrams showing various steps of a method of manufacturing a contactor.
Figure 14B:
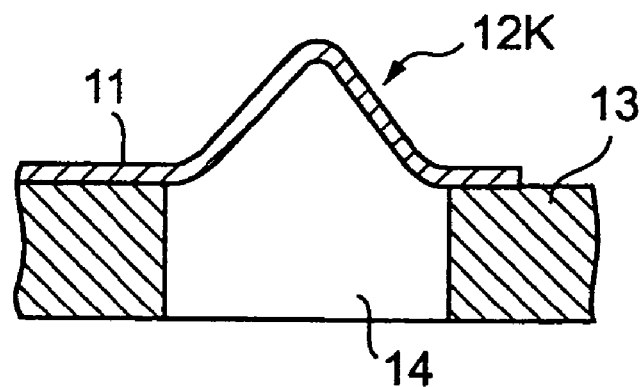
Figure 14C:
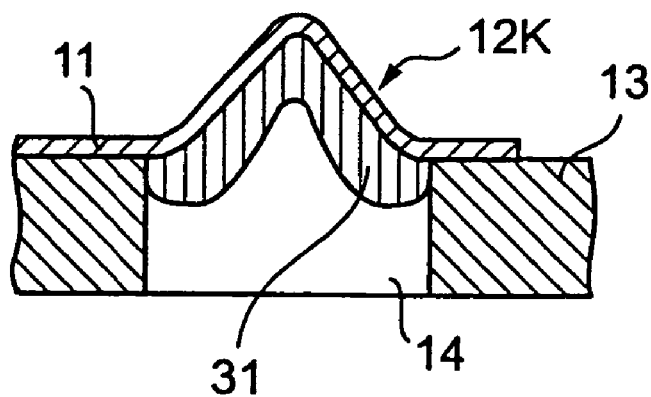

FIGS. 14A to 14C are diagrams showing various steps of a method of manufacturing a contactor. As shown in FIG. 14A, the test wiring board 10K is mounted on a stage 34 of a jig such that the conductive layer 11 is in contact with the stage 34. The protruded member 35 of the jig is placed at the insulating base material 13 side of the test wiring board 10K. The conductive layer 11 is pressed by the protruded member 35 inserted through the hole 14 of the insulating base material 13.

As a result of the pressing process, as shown in FIG. 14B, protruded contacts 12D are formed on the conductive layer 11 at positions corresponding to the electrodes of the electronic component to be tested. Then, as shown in FIG. 14C, a plated part 31 is provided on the protruded contacts 12K on a surface facing towards the holes 14. The plated part 31 serves as a reinforcement member of the protruded contact 12K.

With such the pressing process described above, the protruded contacts 12K of the contactor can be manufactured with reduced period of time, thus with reduced cost.

Figure 15:
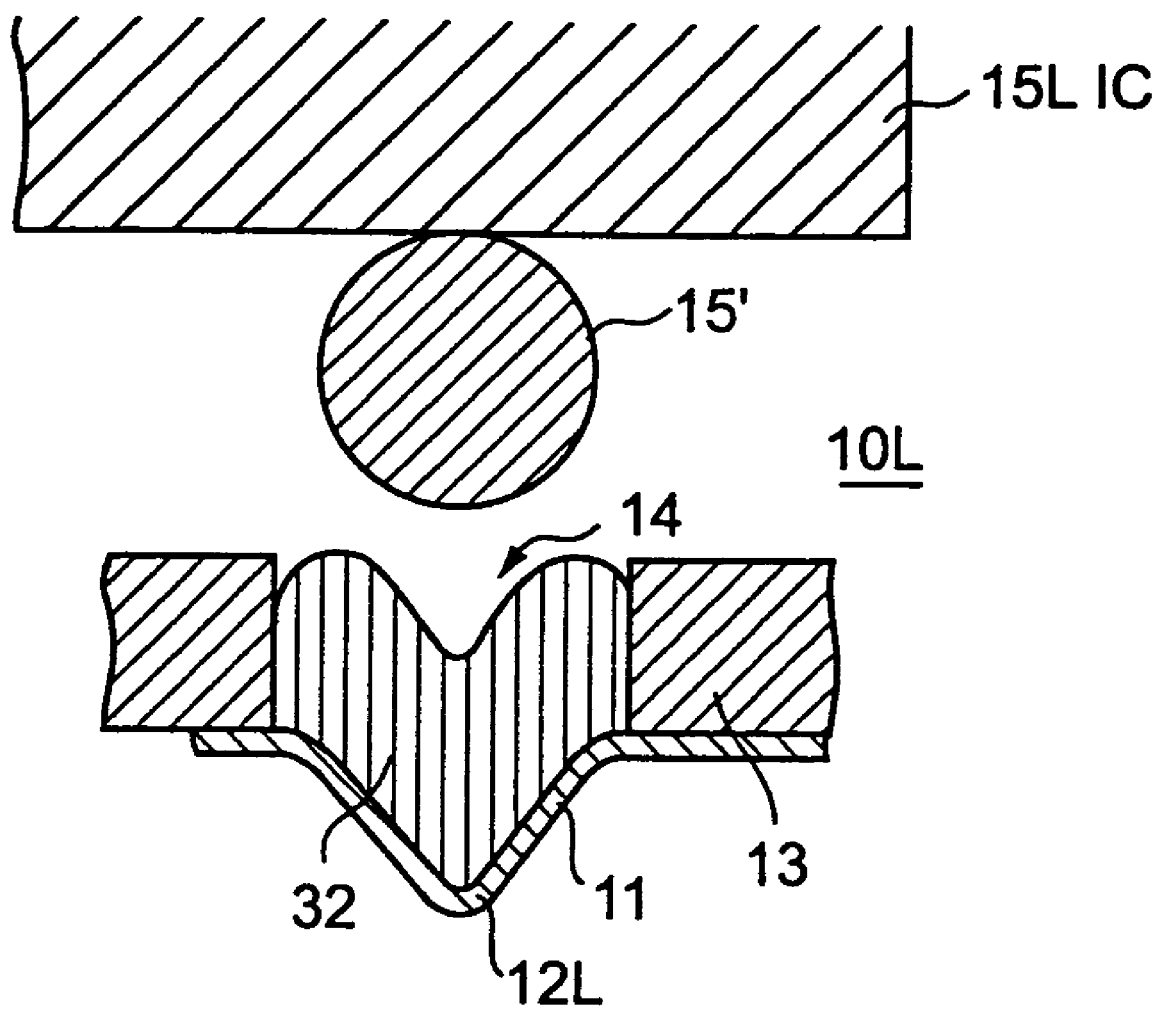
FIG. 15 is a diagram showing a possible arrangement of a contactor used for testing an electronic component having protruded electrodes.

FIG. 15 is a diagram showing a possible arrangement of a contactor 10L used for testing an electronic component 15L having protruded electrodes 15'.

A contactor 10L shown in FIG. 15 includes same elements as those of the contactor 10B of the second embodiment. In FIG. 15, the contactor 10L is arranged in a reversed fashion as compared to the contactor 10B of the second embodiment.

In other words, when testing an electronic component 15L having protruded electrodes 15', a plated part 32 of the contactor 10L comes into contact with the protruded electrode 15'. Thus, the pressure exerted between the protruded electrode 15' and the protruded contact 12L or the plated part 32 will be dispersed. Also, an increased contact area is obtained between the protruded electrode 15' and the protruded contact 12L.

Figure 16:
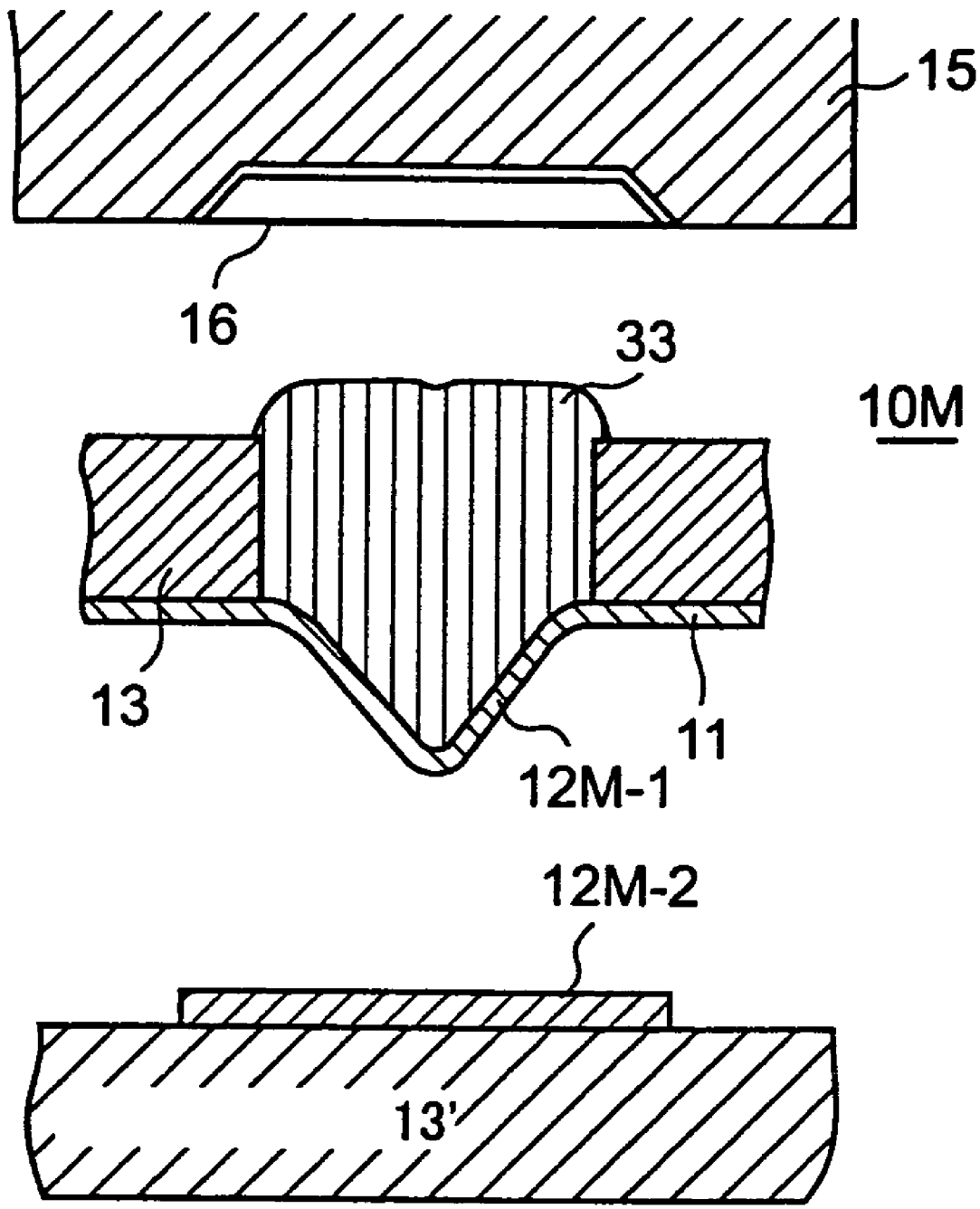
FIG. 16 is a diagram showing a possible arrangement of a contactor used for testing an electronic component having electrode pads.

FIG. 16 is a diagram showing a possible arrangement of a contactor 10M used for testing the electronic component 15 having electrode pads 16.

A contactor 10M shown in FIG. 16 includes same elements as those of the electronic contactor 10E-2 of the fifth embodiment shown in FIG. 6B. In FIG. 16, the contactor 10M is arranged in a reversed fashion as compared to the contactor 10E-2 of the fifth embodiment.

The contactor 10M is arranged such that protruded electrodes 12M-1 protrude towards a direction opposite the electronic component 16. The electrode pad 16 of the electronic component 15 will come into contact with a plated part 33 of the contactor 10M. In the present embodiment, the electronic component 15 is tested by electrically connecting the protruded contact 12M-1 and a contact 12M-2 provided on a separate wiring board 13'.

Thus, by using the separate wiring board 13', a degree of freedom of a wiring layout is increased, so that a high-density electronic component can be tested. Accordingly, an accurate test can be implemented on an electronic.

The contactor of the present invention has been explained with reference to either the electrode pad of the electronic component or the protruded electrode, or without any particular example thereof. However, it is to be noted that contactor of the present invention is applicable to any of the structures described above.

Further, the present invention is not limited to these embodiments, but variations and modifications may be made without departing from the scope of the present invention.

The present application is based on Japanese priority application No. 11-249225 filed on Sep. 2, 1999, the entire contents of which are hereby incorporated by reference.

What is claimed is:

1. A method of manufacturing a contactor used for testing an integrated circuit electronic component provided with a plurality of electrodes, said method comprising the steps of:
    a) preparing a wiring substrate having an insulating base material and a first conductive layer; and
    b) forming contacts by mechanically pressing said wiring substrate with a pressing member such that said first conductive layer is plastically deformed at positions corresponding to said electrodes, and then removing the pressing member.

2. The method as claimed in claim 1, wherein said step a) comprises the step of forming holes in said insulating base material at positions corresponding to said electrodes,
    and wherein said method further comprises the step of:
    c) providing reinforcement members on said contacts a first surface of said contacts, said first surface being facing towards said holes.

3. The method as claimed in claim 1, wherein said first conductive layer is a continuous structure at a point of contact with the electrodes.

* * * * *